United States Patent [19]

Zewail et al.

[11] 4,227,939
[45] Oct. 14, 1980

[54] LUMINESCENT SOLAR ENERGY CONCENTRATOR DEVICES

[75] Inventors: Ahmed H. Zewail; J. Samuel Batchelder, both of Pasadena, Calif.

[73] Assignee: California Institute of Technology, Pasadena, Calif.

[21] Appl. No.: 1,585

[22] Filed: Jan. 8, 1979

[51] Int. Cl.³ .............................................. H01L 31/04
[52] U.S. Cl. .................................... 136/247; 136/259; 250/227; 250/361 R; 250/367; 250/483; 350/96.1; 350/96.34
[58] Field of Search ........ 136/89 FC, 89 CA, 89 CL; 250/227, 361 R, 367, 458, 460, 483, 486–488; 350/96.1, 96.34

[56] References Cited

U.S. PATENT DOCUMENTS

| | | | |
|---|---|---|---|
| 3,934,148 | 1/1976 | Collins | 350/96 R |
| 4,029,519 | 6/1977 | Schertz et al. | 136/89 PC |
| 4,110,123 | 8/1978 | Goetzberger | 136/89 HY |
| 4,127,425 | 11/1978 | Chambers | 136/89 PC |
| 4,130,445 | 12/1978 | Blieden | 136/89 PC |
| 4,140,544 | 2/1979 | Sill | 136/89 PC |
| 4,149,902 | 4/1979 | Mauer et al. | 136/89 PC |

*Primary Examiner*—Aaron Weisstuch
*Attorney, Agent, or Firm*—Poms, Smith, Lande & Rose

[57] ABSTRACT

Increased light output is achieved from a solar energy concentrator light piping device by rendering the top surface of the device concave, and/or forming the device into a close-packing hexagonal shape and/or curving and applying a mirror coating to the output edge of the device.

14 Claims, 12 Drawing Figures

LUMINESCENT SOLAR ENERGY CONCENTRATOR DEVICES

BACKGROUND OF THE INVENTION

1. Field of the Invention

The present invention relates to luminescent solar energy concentrator devices and more particularly, to configurational improvements in a multiple-dye containing luminescent solar concentrator (LSC).

2. Description of the Prior Art

Ground level solar energy radiation is so dilute that devices which concentrate sunlight are utilized before converting it to electrical or thermal energy. These devices typically use geometric optics in the form of mirrors and lenses. In doing so they incur the problems of cost and the requirement of tracking. Optics with high concentration capabilities need to track or be redirected towards the sun on an hourly basis, while even moderate gain devices require adjustments for seasonal changes. Design tolerances and good weathering capability, as well as the need for tracking, make a geometrical optics concentrator an expensive alternative.

A promising new type of solar collector, the Luminescent Solar Concentrator (LSC), has recently been proposed based on light-pipe trapping of molecular fluorescence. Conceptually, the concentrator process proceeds as follows: the solar flux passes into a transparent substrate such as a flat plate which has an index of refraction greater than that of air. The solar photons are absorbed and subsequently randomly reemitted in all directions by fluorescence of an efficient fluorescent dye. Snell's law dictates that a large fraction, typically 75%, of this reemission strikes the surface of the substrate with an angle of incidence greater than the critical angle, so that this fraction of the light is then trapped in the substrate by internal reflection until successive reflection carries it to the edge of the plate where it enters an absorber placed at the edge of the plate. If light enters the face of area $A_f$ and leaves via an edge of area $A_e$, the net geometric gain $G_{geom}$ is:

$$G_{geom} = A_f/A_e \quad (1)$$

Of the proposed solar-energy technologies, photovoltaic conversion offers the unique advantages of direct conversion of photons to electrical energy combined with simplicity, low maintenance, and high redundancy. Important problems related to the improvement of photovoltaic conversion efficiency are (a) how to maximize the fraction of the solar spectrum collected and (b) how to improve the methods for coupling solar photons to the photovoltaic junction. The LSC can potentially aid in the solution of both (a) and (b). Important advantages of the LSC collector are: it does not have to be steered to track the sun; it is nearly as efficient in diffuse as in direct sunlight; it reduces heat dissipation in the edge-mounted solar cells, since the excess energy of the short-wavelength photons is dissipated over the entire area of the LSC.

A series of such concentrators, each containing a different dye and attached to a different type of solar cell, can be stacked in such a way that the solar spectrum could be sorted and routed to a variety of photovoltaic devices. It also has been shown that if a number of properly selected dyes were placed within the same substrate, that not only did the absorption band increase but that radiative and non-radiative transfer of excitations between the dyes could take place, greatly increasing the overall collection efficiency. Each dye will absorb the solar flux within its absorption band. The emission of this dye is absorbed by a different dye, forming the so-called photon cascade. The device has been designated as the multiple dye Planar Solar Collector ($PSC_m$), which is an extension of the single dye $PSC_s$.

The principle advantages of the LSC or PSC is its low initial cost and indifference to solar angle of incidence. It should be noted though that while the LSC is a high gain collector it is also a lossy collector. A fraction of the photon's energy is dissipated in the cascade process, and this fraction would be waste heat for photothermal collection. Because of this the primary application will be in photovoltaic conversion. Efficient photovoltaic cells (PVC) are costly, and hence will benefit most dramatically from the high geometric gains possible in an LSC; in fact, their efficiency increases with such high flux levels. Further, waste energy usually dissipated in the PVC is released in the LSC matrix, reducing the cell's operating temperature.

The present invention relates to geometric improvements designed to provide increased and uniform output of light at the edge of luminescent solar concentrators.

SUMMARY OF THE INVENTION

An isotropic distribution of dye molecules in a planar LSC allows typically about 26% of the luminescence to be lost out of the face of the LSC via the critical cone. It should be noted that the final performance of the LSC is governed by a relatively high power of the critical cone loss. Studies of self-absorption show that if P is the probability that luminescence will be lost out of the critical cone, that the complete LSC system performance will scale as $(1-P)^N$, where N is typically some number close to 4. For this reason, it is extremely important to reduce the critical cone as much as possible.

In accordance with the invention, it has been discovered that if the surface of the LSC exposed to solar radiation is made convex the critical cone area pointing upwardly is squeezed down, reducing the critical cone loss by 30% using a one-dimensional concave ripple and by an additional 30% using a two-dimensional concave ripple.

The critical cone loss mechanism can also be utilized to increase the gain at the edge of the LSC device. Because of this loss, the light emerging from the edge and incident on a photo-voltaic cell (PVC) attached to a typical planar LSC is not isotropic, i.e., there will be essentially no flux within the critical cones emanating from a point on the PVC. The remaining luminescence can be concentrated by curving the edge, suitably into a truncated ellipse, and mirroring the curved surfaces. This increases gain without incurring losses from transporting the light through longer path lengths in the matrix. In polymethylmethacrylate (PMMA) this will provide an additional gain factor of 1.35 with an exposed mirror length of 0.78 times the plate thickness.

A common problem in photovoltaic power generation is that the performance of a number of cells in series will be that of the most inefficient cell in the series. By inefficient is meant the cell that generates the least amount of current. Typically, this is partially circumvented by operating the cells in parallel instead of in series; however, this causes problems in that the resulting high currents generate ohmic losses. The general practice has therefore been to always match as closely as possible the output of all the cells in an array.

This problem leads to an important consideration in the design of an LSC. The output light intensity on all attached PVCs should be as nearly constant as possible. From group theory there are two planar geometries where this is guaranteed to be true: one is an infinite ribbon; and the other is a disc. In a rectangular slab LSC, the cells near the corner receive the least light and have the poorest performance while a disc plate cannot be closely packed in a plane. It has further been discovered according to this invention if an approximation to the disc is used, namely a hexagon, adequately uniform illumination can be achieved all around the edge, while gaining the ability to close-pack the LSC elements in a plane. The light level varies less than 5% over 75% of the edge of a hexagonal LSC which is quite satisfactory for photovoltaic conversion.

An optimum LSC device according to the invention is composed of an array of hexagonal, hemispherical sections forming a two-dimensional concave ripple and having curved, mirrored elliptical output edges to which are attached PVC devices connected in combinations of parallel and series.

These and many other features and attendant advantages of the invention will become apparent as the invention becomes better understood by reference to the following detailed description when considered in connection with the accompanying drawings.

DESCRIPTION OF THE PREFERRED EMBODIMENTS

Figure 1:
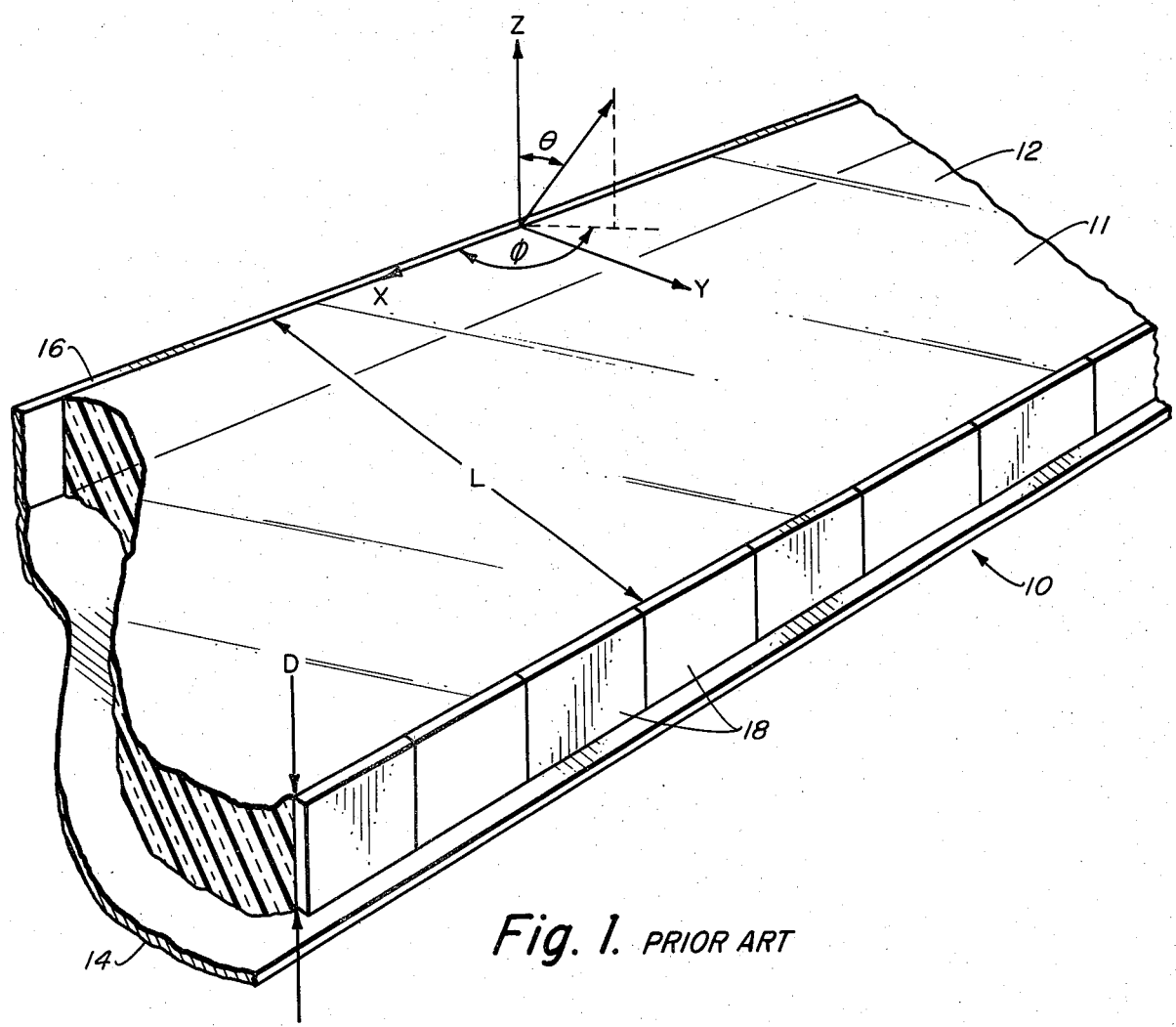
FIG. 1 is a schematic, perspective view of a prior art PSC.

Referring now to FIG. 1, the prior art Planar Solar Concentrator (PSC) 10 is an infinite flat ribbon 11 having a top face 12 exposed to incident sunlight; a mirrored coating 14 on the back surface, a mirrored coating 16 on one side edge and an array of photovoltaic cells 18 on the opposite edge. The ribbon is formed of an optically clear matrix having an optical density $<0.05$ in the active wavelengths of the device. Typical matrix materials are glasses such as soda glass or plastics such as polycarbonate or acrylic ester polymers such as polymethylmethacrylate (PMMA).

Figure 2:
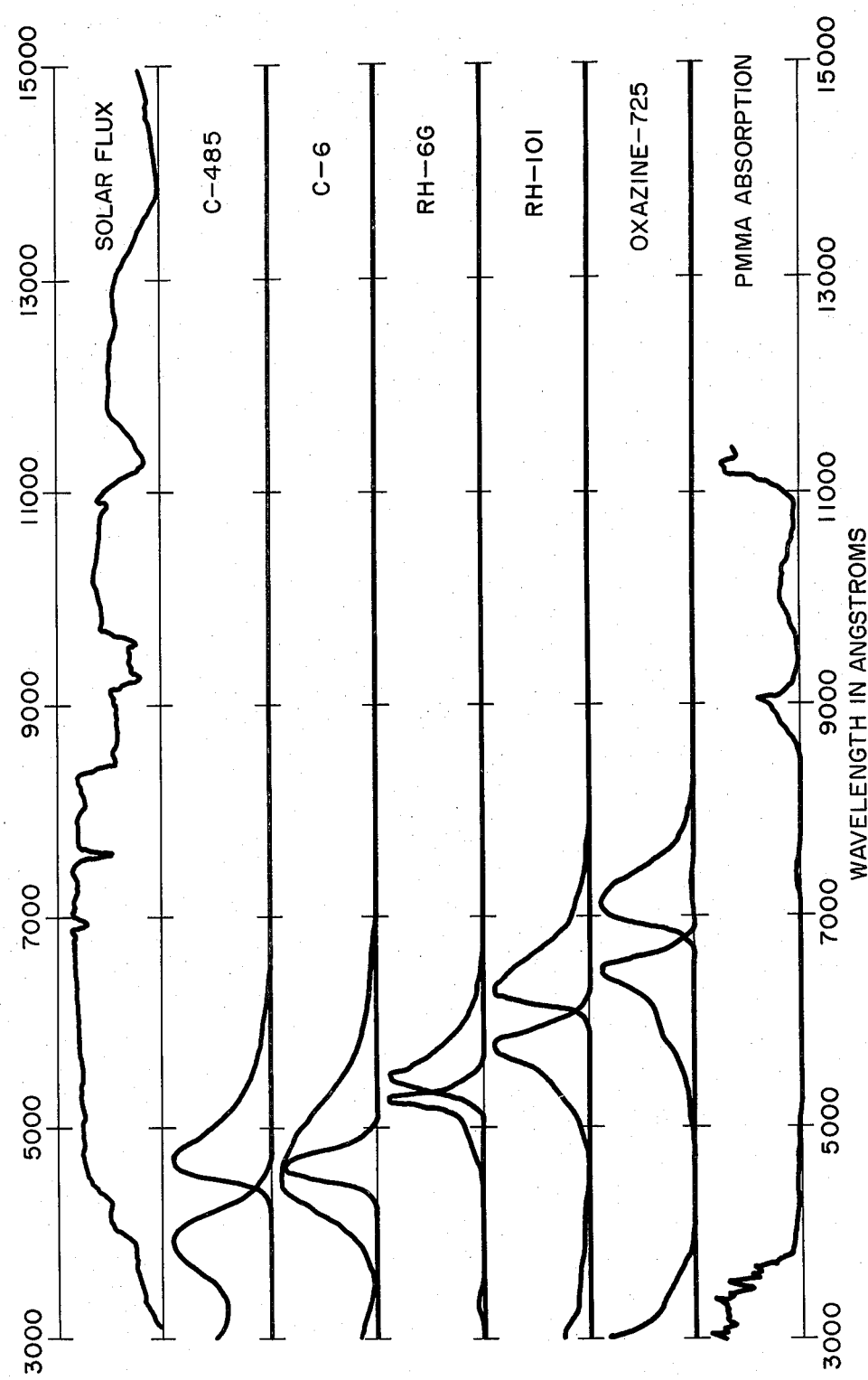
FIG. 2 is a series of absorption spectra of a typical five-dye cascade shown with the solar spectrum and PMMA absorption.
Figure 3:
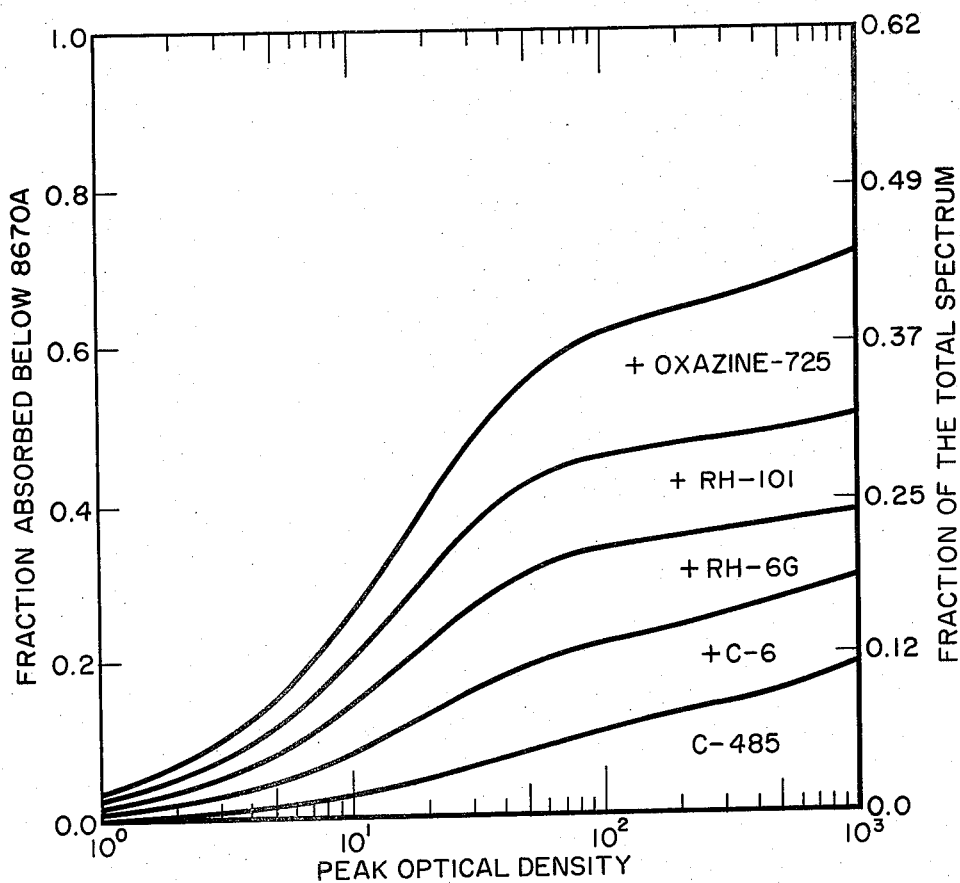
FIG. 3 is a series of graphs showing fraction of the solar flux absorbed for a one to five-dye LSC.

The matrix material is in optical communication with luminescent absorbers such that light entering the ribbon is absorbed by the luminescent absorbers and reemitted within the ribbon. The luminescent absorbers must have a uniform concentration per unit area. The absorbers can either be uniformly dispersed throughout the volume of the ribbon matrix or can be applied to as a layer to the back surface of the ribbon. The luminescent absorbers should have a high quantum efficiency of luminescence greater than 50%, usually greater than 90%. The absorbers can be inorganic ions such as chromium, neodymium or itrium dispersed in glass or organic fluorescent dyes dispersed in a plastic matrix, usually organic laser dyes having high quantum efficiency, high stability, and being very highly purified. The dyes are usually present in a concentration of from $10^{-2}$ to $10^{-5}$ Molar. The concentration of each dye is chosen such that each dye has the same peak optical density. Since the absorption level of a single absorber such as Rh-6G only covers a small fraction of a visible spectrum, the ratio of surface area to the edge area must be made extremely large, i.e., about $10^3$ to achieve good overall photon flux. This problem can be overcome by coupling or cascading the fluorescence of one dye to the absorption of another. In fact by selecting the right set of dyes, it is feasible to absorb nearly all of the visible spectrum of the sun. Provided efficient energy transfer occurs, the device will emit in a narrow band near the wavelengths of a maximum efficiency of the photovoltaic cell. Planar solar concentrators of PMMA doped with dyes are cast from solutions of the dye in monomer, usually in absence of solvent. The concentrators which have good optical quality are then sanded to size and the edges polished. Preferably, at least 5 dyes are utilized to provide a very broad, efficient absorption band for the device. The dyes are chosen such that the first dye has the highest energy of luminescence in the spectrum and the last dye has the lowest. Each dye's emission spectrum overlaps the absorption band of the succeeding dye. The absorption spectrum of a five dye cascade device is shown in FIG. 2, along with the solar flux spectrum and the absorption spectrum for PMMA. As shown in FIG. 3, the fraction of the solar flux absorbed increases from about 0.12 for a single dye LSC to about 0.45 for a 5-dye cascade LSC device.

Referring again to FIG. 1, sunlight enters the device from the Z direction, traverses the thickness D of the device during which a dye absorbs a certain portion of the spectrum. The trapped portion of the resultant emission then propagates to the photovoltaic cells 18. As discussed above, dye emissions incident to the LSC surface at an angle greater than $\theta_c$ are totally internally reflected. The cone formed by all rays originating at the point of luminescence and forming an angle $\theta_c$ with the surface is called the critical cone. In general, the polar angle formed by these rays will be a function of depth $\theta$ and azimuth angle $\phi$. The fraction of luminescence lost out of the critical cone, not shown for PMMA plate is 0.26.

Figure 4:
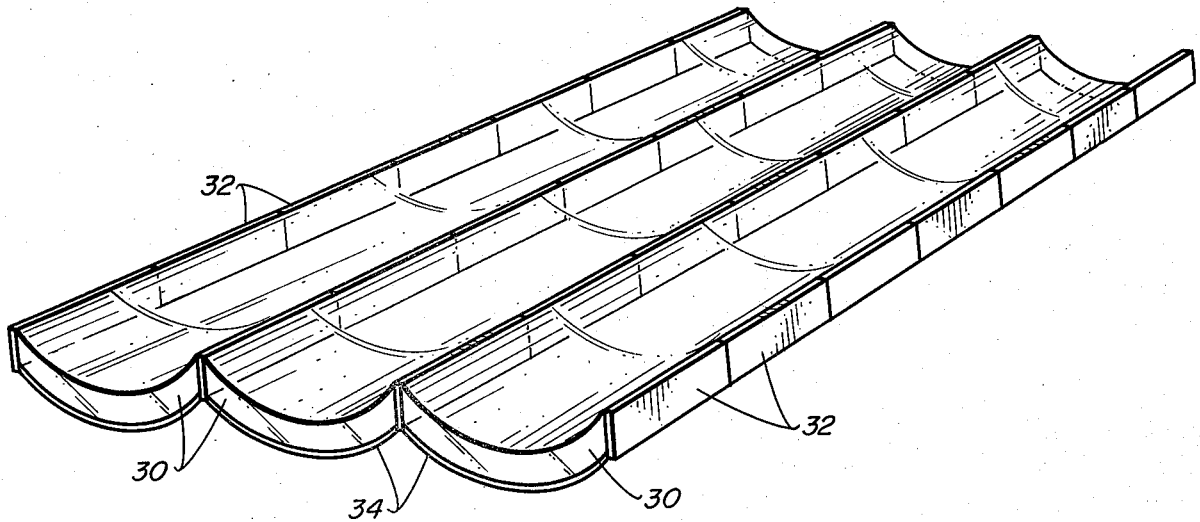
FIG. 4 is a schematic, perspective view of a single ripple, cylindrical LSC.
Figure 5:
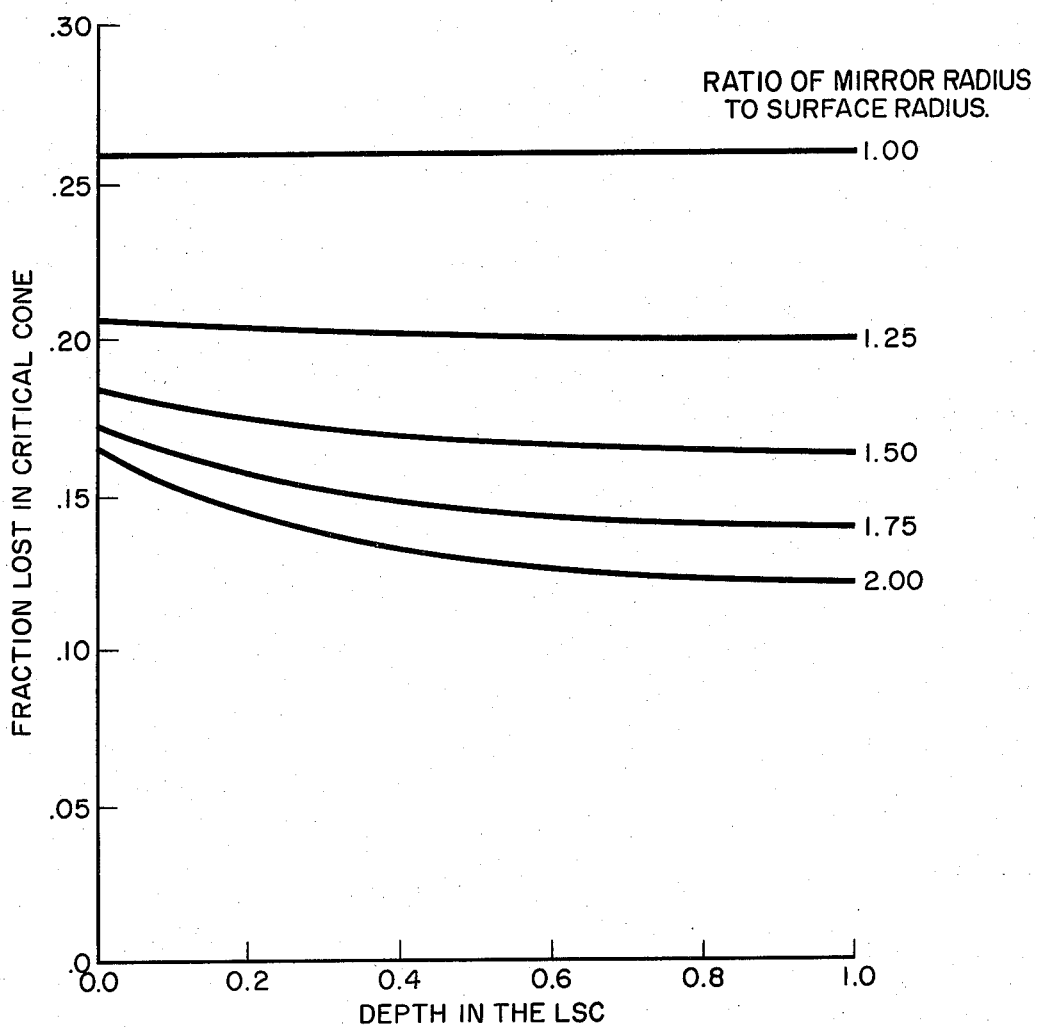
FIG. 5 is a series of curves showing critical cone loss for different convex single curvature ripple cylindrical LSC's.

The fraction of light lost is very sensitive to the geometry of the surface and a considerable decrease in the amount of light lost is possible with the use of non-planar geometry. If the surface of an LSC is made everywhere concave, loss of luminescence out of the critical cone can be reduced. The back surface of the device can either be convex or flat since the losses from the large critical cone area pointing downwardly can be returned to the device by applying a mirrored coating to the back. A simple cylindrical one-dimensional ripple device can be formed by extrusion or thermal forming, as seen in FIG. 4; the cylindrical channels or ripples 30 of an LSC have PVC cells 32 bonded to an edge and a mirrored coating 34 applied to the back surface. Since each edge is capable of emitting light the PVC's may be arranged back to back along the interior lines of the corrugations. The decrease in the critical cone losses is governed by the ratio of the back mirror to surface radii of curvature. The fraction of light lost in the critical cone loss is shown in FIG. 5 for different radii ratios. Thus it is seen that it is quite straightforward to reduce the critical cone loss by 30% by using a one-dimensional ripple. When the ratio of the back radius to the surface radius is 1.22 the geometric gain is 5.

Figure 6:
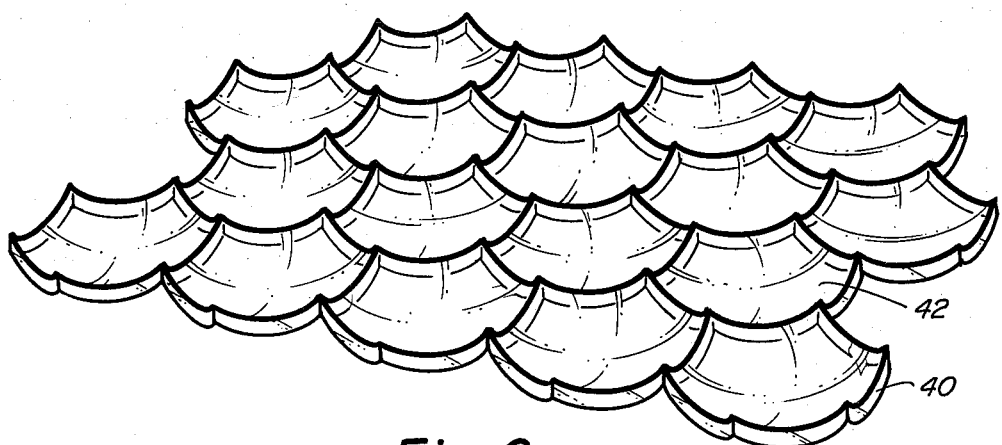
FIG. 6 is a schematic, perspective view of a double ripple, hexagonal LSC shown in a planar array.

Referring now to FIG. 6, an LSC array device utilizing a two-dimensional ripple as illustrated. This LSC device is composed of an array 40 of hexagonal hemispherical sections 42. This two-dimensional ripple device can reduce the critical cone loss by 30% over that of the corrugated device of FIG. 5. The concave curvature can be cylindrical, spherical, elliptical or parabolical, etc.

In a photovoltaic planar LSC, an important consideration is uniform illumination of the cells since the performance of a number of cells in series will be that of the least efficient cell in the series. Therefore the emitted light intensity from the LSC to all attached PVCs series should be as nearly uniform as possible. There are only two planar geometries where this is guaranteed to be true: one is the infinite ribbon and the other is a disc. However, the disc does not closely pack in a plane. The only planar configurations that will closely pack are a triangle, a rectangle and the hexagon. Uniform output from a triangle is very poor and cells placed near a corner of a rectangle would see very little light. A hexagon is a very close approximation to a disc with a further advantage that hexagon devices can be closely packed in a plane to form an array of hexagonal LSC modules and further has the advantage that they can be curved into hemispherical sections providing the further advantage of concavity as previously discussed.

Figure 7:
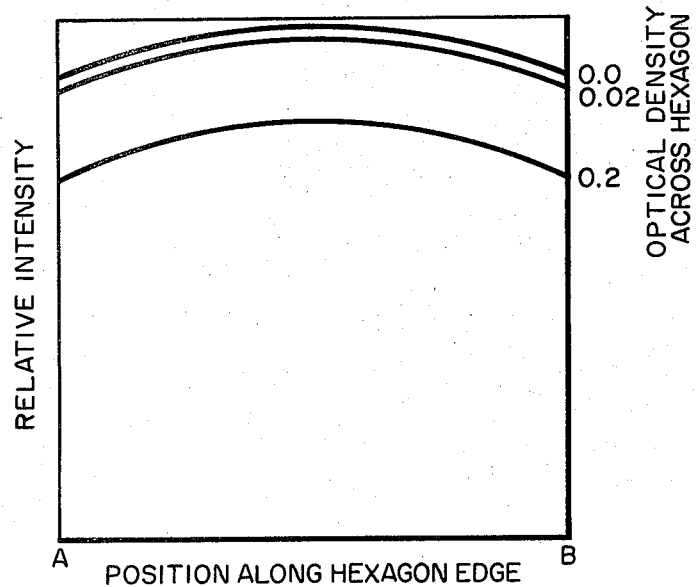
FIG. 7 is a series of curves showing variations of light intensity across the edge of a hexagonal LSC.
Figure 8:
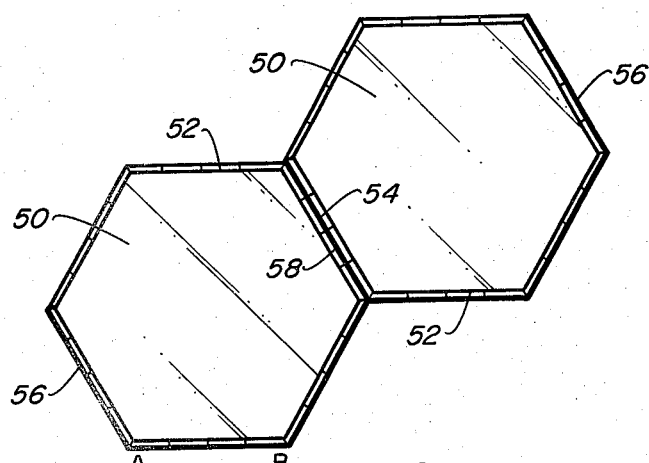
FIG. 8 is a schematic view of a hexagonal LSC array.

Referring now to FIG. 7, the intensity of collected light has been computed along the edge of a hexagonal LSC for a variety of optical densities of the matrix materials. The densities correspond to 0%, 5% and 30% absorption of the final emission directly across the hexagon. The conclusion is that over 75% of each edge the light level varies less than 5%, which is quite satisfactory for photovoltaic conversion and the intensity is constant to within 15% over the entire edge for all the optical densities of interest. As seen in FIG. 8, the hexagon module 50 is a plate of LSC in the form of a hexagon having edges 52 to which are attached the active face of a PVC 54 or a mirror coating 56. As shown in FIG. 8, PVC's 54, 58 can be inserted back to back along the intersections of a closely packed hexagonal LSC array.

Figure 9:
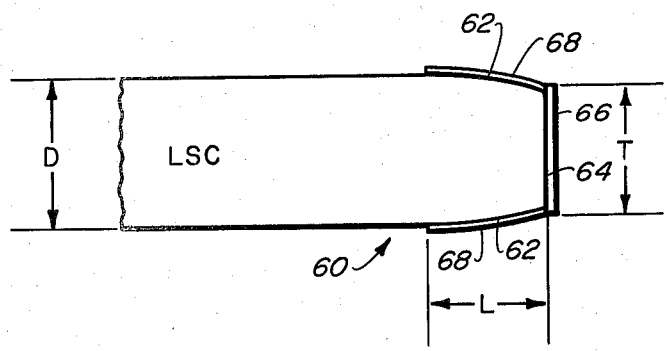
FIG. 9 is a side view in elevation of an edge collector.

Further gain of output light can be achieved by the use of an edge collector in accordance with this invention. Because of the critical cone loss mechanism, the light incident on the face of a PVC attached to the edge of a typical planar LSC is not isotropic. Therefore, there is essentially no flux within the critical cone emanating from a point on the PVC. However, if the edge is convexly curved and mirrored over the curved length, the light can be concentrated and extra gain achieved without incurring losses from transporting the light through longer path-lengths in the matrix. Referring now to FIG. 9, the edge collector 60 is formed by curving the edge 62 into a convex curvature, preferably elliptical having a flat edge 64 to which is attached a PVC 66 and having a mirrored coating 68 applied to the curved portion. The curved edges can be formed by extrusion, or by shaving the edge into a truncated ellipse. The mirrored ellipse has the property that any light entering the opening with an angle of incidence with respect to the plane of the PVC less than $\sin^{-1}(t/D)$ will be deflected to intersect the face of the PVC. In an LSC, the critical cone loss automatically gives this maximum angle to be $\pi/2 - \theta_c$ so that the gain, G, that can be achieved by such an edge collector is:

$$G = (1 - 1/n^2)^{-\frac{1}{2}}$$

where n is the index of refraction of the matrix material. In PMMA this will provide an additional gain factor of 1.35 with an exposed mirror length of 0.78 times the LSC thickness. The exposed mirror length, L, is calculated as follows:

$$L = (D/2n)[1 + (1 - 1/n^2)^{-\frac{1}{2}}]$$

where D is the slab thickness.

Figure 10:
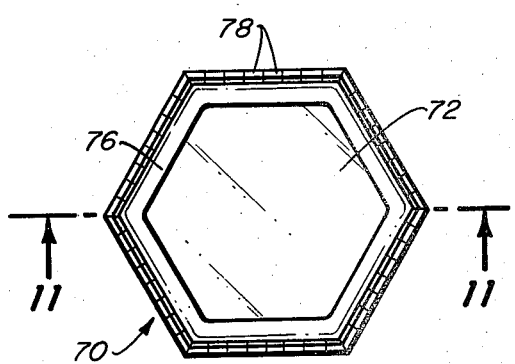
FIG. 10 is a schematic view of a convexly curved, hexagonal LSC having a curved, mirrored edge collector.
Figure 11:
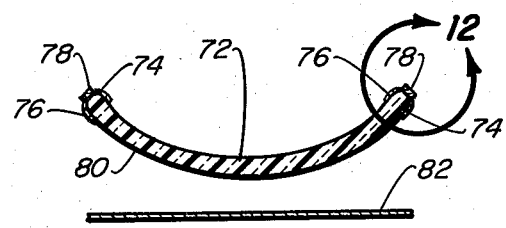
FIG. 11 is a sectional view taken along line 11—11 of FIG. 10.
Figure 12:
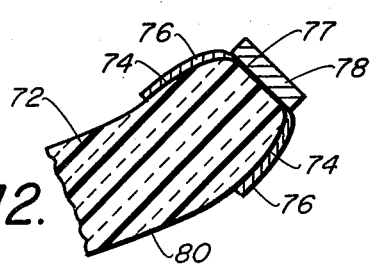
FIG. 12 is a sectional view taken along line 12—12 of FIG. 11.

Optimum gain is achieved in the LSC shown in FIGS. 10, 11 and 12 in which the LSC 70 is in the form of a hexagon having a concave front surface 72 and convexly curved side edges 74. The curved edges contain a mirror coating 76 applied thereto and each terminates in a flat edge 77 for receiving a PVC 78. A separate reflective lazer 82 is disposed below the bottom surface 80.

It is to be realized that only preferred embodiments of the invention have been described and that numerous alterations, modifications and substitutions are all permissible without departing from the spirit and scope of the invention as defined in the following claims.

What is claimed is:

1. In a light concentration device comprising a transparent substrate having an index of refraction greater than that of the ambient surrounding the device, and having an incident light receiving front surface, a back surface, a light emitting side edge and containing a uniform concentration of at least one efficient fluorescent dye for absorbing said light and reemitting light by fluorescence which travels through said substrate to said edge, the improvement comprising said substrate having a concave front surface and the ratio of the radius of curvature of the back surface to the radius of curvature of the front surface is greater than 1.0.

2. A device according to claim 1 in which the dye is present as a layer on the back surface of the substrate.

3. A device according to claim 1 further including a reflective layer disposed below the bottom surface of the substrate.

4. A device according to claim 1 in which the substrate is an optical-grade acrylic polymer.

5. A device according to claim 1 in which the top surface is concave in one dimension.

6. A device according to claim 5 in which the top surface is cylindrical.

7. A device according to claim 5 in which the surface is concave in two dimensions.

8. A device according to claim 1 in which the substrate is in the form of a hexagon.

9. A device according to claim 1 in which the terminal portion of the light emitting side edge is convexly curved and the curved portions contain a reflective layer.

10. A device according to claim 1 further including a photovoltaic cell applied to the output edge of the substrate.

11. A device according to claim 1 in which the substrate contains an isotropic concentration of a plurality of fluorescent dyes each having a different absorption band and each having an emission spectrum overlapping the absorption band of another of the dyes.

12. A device according to claim 11 in which the dyes are each present in the substrate in an amount from $10^{-2}$ to $10^{-5}$ M.

13. A device according to claim 12 in which the ratio of the radius of curvature of the back surface to the radius of curvature of the front surface is from 1.0 to 2.0.

14. A solar collection assembly comprising in combination an array of hexagonal luminsecent solar concentrator elements placed edge to edge formed of transparent material having an index of refraction greater than that of the surrounding ambient and containing at least one efficient fluorescent dye, the front surface of each element having a concave curvature and a short portion of the front and back surface of each element adjacent each edge having a convex curvature and a reflective coating applied to the convexly curved portion; and at least one photovoltaic cell disposed between each of the edge intersections.

* * * * *